(12) United States Patent
Li et al.

(10) Patent No.: US 6,235,145 B1
(45) Date of Patent: *May 22, 2001

(54) SYSTEM FOR WAFER CLEANING

(75) Inventors: Li Li, Meridian; Donald L. Westmoreland, Boise; Richard C. Hawthorne, deceased, late of Nampa, by Elvia M. Hawthorne, heir; Kevin Torek, Boise, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/119,160

(22) Filed: Jul. 20, 1998

Related U.S. Application Data (63) Continuation of application No. 08/659,145, filed on Jun. 5, 1996, which is a continuation-in-part of application No. 08/559,188, filed on Nov. 13, 1995.

(51) Int. Cl.$^7$ ............................. C23F 1/02; H01L 21/3065
(52) U.S. Cl. ............................. 156/345; 438/706; 134/1.2
(58) Field of Search .................... 134/1.2, 902; 156/345; 438/706

(56) References Cited

U.S. PATENT DOCUMENTS

| | | |
|---|---|---|
| 4,634,509 | 1/1987 | Shimizu et al. . |
| 4,692,398 | 9/1987 | Durham . |
| 4,717,681 | 1/1988 | Curan . |
| 4,729,941 | 3/1988 | Itoh et al. . |
| 4,749,440 * | 6/1988 | Blackwood et al. ................. 438/706 |
| 4,777,119 | 10/1988 | Brault et al. . |
| 4,810,613 | 3/1989 | Osuch et al. . |
| 4,857,142 | 8/1989 | Syverson . |
| 4,983,490 | 1/1991 | Durham . |
| 4,996,627 | 2/1991 | Zias et al. . |
| 5,039,349 | 8/1991 | Schoeppel . |
| 5,089,084 * | 2/1992 | Chhabra et al. ..................... 438/706 |
| 5,114,826 | 5/1992 | Kwong et al. . |
| 5,129,955 * | 7/1992 | Tanaka ...................................... 134/2 |
| 5,175,124 | 12/1992 | Winebarger . |

(List continued on next page.)

OTHER PUBLICATIONS

Jensen, Mark et al., "BPSG to Thermal Oxide Etch Selectivity for Contact Clean Applications", *Technical Report DC/DE, TR 362*, pp. 1–9 (1991).

(List continued on next page.)

*Primary Examiner*—Robert Kunemund
*Assistant Examiner*—Lynette T. Umez-Eronini
(74) *Attorney, Agent, or Firm*—Mueting, Raasch & Gebhardt, P.A.

(57) ABSTRACT

A method of cleaning wafer surfaces includes providing a wafer surface and cleaning the wafer surface using at least hydrofluoric acid (HF) and an etch reducing component. The etch reducing component is from the group of (R)$_4$NOH wherein R=(C$_1$–C$_{20}$)alkyls, either straight or branch chained, and further wherein each R is independently a (C$_1$–C$_{20}$)alkyl, preferably a (C$_1$–C$_4$)alkyl, and more preferably one of tetra ethyl ammonium hydroxide (TEAH) and tetra methyl ammonium hydroxide (TMAH). A cleaning solution for use in cleaning a wafer surface includes an H$_2$O diluted HF solution and an etch reducing component from the group above, preferably, TMAH. A system for performing an HF vapor cleaning process includes a vapor chamber for positioning a wafer having a wafer surface and means for providing an HF vapor to the vapor chamber. The HF vapor includes an inert carrier gas, an HF component, one of a water vapor or an alcohol vapor, and an etch reducing component. The etch reducing component may be from the group above, preferably, TMAH.

6 Claims, 5 Drawing Sheets

U.S. PATENT DOCUMENTS

| | | |
|---|---|---|
| 5,209,858 | 5/1993 | Heinsohn et al. . |
| 5,259,888 | 11/1993 | McCoy . |
| 5,290,361 | 3/1994 | Hayashida et al. . |
| 5,294,568 | 3/1994 | McNeilly et al. . |
| 5,350,489 | 9/1994 | Muraoka . |
| 5,350,714 | 9/1994 | Trefonas, III et al. . |
| 5,374,503 | 12/1994 | Sachdev et al. . |
| 5,439,564 | 8/1995 | Shimizu et al. . |
| 5,498,293 | 3/1996 | Ilardi et al. . |
| 5,571,375 | 11/1996 | Izumi et al. . |
| 5,584,963 | 12/1996 | Takahashi . |
| 5,662,772 * | 9/1997 | Scheiter et al. ............ 216/2 |
| 5,783,495 * | 7/1998 | Li et al. ............... 438/738 |

OTHER PUBLICATIONS

Kern, Werner et al., "Cleaning Solutions Based on Hydrogen Peroxide for use in Silicon Semiconductor Technology", *RCA Review*, pp. 187–207 (1970).

Miki, Nobuhiro et al., "Gas–Phase Selective Etching of Native Oxide", *IEEE Transactions on Electron Devices Society*, 37 (1), pp. 107–115 (1990).

*Semiconductor International*, "New Clean Challenges RCA Clean's Domination", pp. 18–19 (Sep. 1995).

*Semiconductor International*, "Wafer Cleaning: Making the Transition to Surface Engineering", pp. 88–92 (Oct. 1995).

Witowski et al., "Characterization of an Anhydrous HF Pre–Gate Oxidation Etching Process", *Proceedings of the Second International Symposium on Cleaning Technology in Semiconductor Device Manufacturing*, 92–12, pp. 372–408 (1992).

\* cited by examiner

SYSTEM FOR WAFER CLEANING

RELATED APPLICATION

This is a continuation of application Ser. No. 08/659,145, filed Jun. 5, 1996, (pending), and a continuation-in-part application of U.S. patent application Ser. No. 08/559,188 filed on Nov. 13, 1995 and hereby incorporated in its entirety by reference which is incorporated herein by reference.

FIELD OF THE INVENTION

The present invention relates to wafer cleaning or etching methods used in the fabrication of semiconductor devices. More particularly, the present invention pertains to methods of removing native oxide on the wafers in the fabrication of semiconductor devices while controlling the etching of other regions of the wafers. Further, the present invention relates to solutions and systems with regard to such methods.

BACKGROUND OF THE INVENTION

A large variety of thin films are used in the fabrication of semiconductor devices. The uniformity of a wafer must be tightly maintained throughout the entire fabrication process in order to allow increasingly fine and microscopic geometric features to be precisely formed. Every layer deposited on the top surface of the wafer that possesses irregularities and variations in its uniformity has an adverse effect during subsequent processing steps that the %wafer undergoes. Uniformity of the layers is a critical factor in semiconductor wafer production. It is, therefore, important that the wafer surface be as clean as is technically possible before each fabrication step in order to obtain the precision and high yields in semiconductor fabrication. To accomplish these fabrication goals, *wet process wafer cleaning and/or wet etching procedures are carried out prior to many of the process steps.

When a silicon wafer is chemically cleaned prior to a furnace or baking step, a widely used cleaning technique includes the RCA method or RCA clean (RCA Review, pp. 187–206 (June, 1970)). The conventional RCA clean is, for example, conducted at high temperature and includes use of a first cleaning solution, Standard Clean 1 (SC1) consisting of a dilution of ammonium hydroxide/hydrogen peroxide ($NH_4OH/H_2O_2$) followed by a deionized (DI) water rinse. Then, a second cleaning solution, Standard Clean 2 (SC2) which is a hydrochloric acid/hydrogen peroxide (HCL/$H_2O_2$) dilution is used and a second DI water rinse is performed. The PICA clean provides a chemical oxide passivated wafer surface.

Another wet cleaning method that has been recently used as an alternative to the RCA clean is the Baker clean. The Baker clean is a relatively short two-step process, instead of the longer, for example, four step RCA clean. The Baker clean uses a proprietary cleaner, JTB-100 (J. T. Baker Microelectronics, Mallinckrodt Baker, Inc., Phillipsburg, N.J.) and a single DI water rinse. The JTB-100 contains tetra methyl ammonium hydroxide (TMAH) and is designed to be used in conjunction with $H_2O_2$ The Baker clean appears to have improvements over the RCA clean in terms of simplicity, decreased impurity levels and chemical stability in the cleaning bath.

There are also other wet cleaning methods utilized, such as, for example, the Piranha clean which uses sulfuric acid ($H_2SO_4$) based mixtures. For example, the sulfuric acid may be used with hydrogen peroxide.

Although the above described cleaning techniques are widely utilized, wet etching or surface conditioning of silicon dioxide ($SiO_2$) films in semiconductor fabrication processes, is usually accomplished by hydrofluoric acid (HF) cleaning, such as by immersion in HF solutions, spraying with HF solutions, or treatment by HF vapors. As is known to one skilled in the art, a thin oxide grows on silicon when it is exposed to air. This thin oxide, known as native oxide, can adversely affect subsequent fabrication steps. The HF wafer cleaning removes the native oxide from the surface and provides a hydrogen passivated oxide free silicon surface which is desirable prior to many process steps. The HF cleaning may be performed before, after, or between cleaning steps performed with other solutions or vapors, such as with the RCA clean, to remove native oxide and pros ide a hydrophobic oxide free surface.

However, HF cleans, while etching native oxide, also etch other commonly formed regions of the wafer, for example, doped or deposited oxides such as borophosphosilicate glass (BPSG) and tetraethylorthosilicate (TEOS) based oxides. These other formed regions are etched to quickly relative to the removal of native or thermal oxides for accomplishing adequate process control and which may cause difficulty in process integration. As the doping in deposited oxides increases, the etching of such oxides occurs even faster relative to native or thermal oxides, further increasing process control problems.

In addition, with the use of cluster-based tools and processes, the demand for in situ cleaning which is integrated into a multi-purpose module for use in the cluster tool increases. The use of HF vapor clean is a process that would be beneficial for use in cluster tools. However, in the HF vapor clean, the etching of thermal or doped oxides is even faster relative to the etching of thermal or native oxide than with the use of an HF solution clean.

Therefore, the etch selectivity ratio of deposited or doped oxides to thermal or native oxide is considerably high and inadequate in many circumstances when using conventional HF clean methods and solutions/vapors utilized therewith. Such ratios for HF vapor cleans have been shows to be as low as 4:1 and 5:1 as described in the FSI "Technical Report DC/DE -Dry Cleaning/Dry Etching," FSI International, Chaska, Minn. (1990). This article appears to indicate that such ratios are achieved by changing the initiation of the etch reaction using increased amounts of water vapor in the HF vapor to initiate the thermal or native oxide removal faster.

Further, the use of HF cleans also has the disadvantage of providing poor wettability on the wafer surface and contributes to surface microroughness. With increasing fine geometries and patterns fabricated into the wafers, as for example with high aspect ratio contact holes, conventional HF solutions are not as effective in cleaning the silicon surfaces at the bottom of such patterns.

As described above, the etch selectivity ratio of two different oxides is of importance when applying an etch process to a wafer surface. This is of particular importance when the objective is to remove small amounts of native oxide, for example, from a silicon contact area or any other active area, yet limit the etching of an adjacent oxide, such as a deposited or doped oxide, which normally has a higher etch rate than the native oxide. Therefore, improvements in the currently available cleaning processes are needed to improve the effectiveness of the wafer clean, and particularly to reduce the etch selectivity ratio of etching other wafer regions, such as doped oxides, to the etching of thermal or native oxides.

SUMMARY OF THE INVENTION

A system of the invention for performing an HF vapor cleaning process includes a vapor chamber for positioning a wafer having a wafer surface and and means for providing an HF vapor to the vapor chamber. The HF vapor including an inert carrier gas, an HF component, one of a water vapor or an alcohol vapor, and an etch reducing component. The etch reducing component being from the group of $(R)_4NOH$ wherein $R=(C_1-C_{20})$alkyls, either straight or branch chained, and further wherein each R is independently a $(C_1-C_{20})$alkyl, preferably a $(C_1-C_4)$alkyl, and more preferably one of tetra ethyl ammonium hydroxide (TEAH) and tetra methyl ammonium hydroxide (TMAH).

DETAILED DESCRIPTION OF THE EMBODIMENTS

The present invention shall be described with reference to FIGS. 1–5, the Examples, and the Tables provided herein. The present invention provides improved wafer surface cleaning in the production of semiconductor wafers. Further, the present invention provides for effective removal of native oxide on a wafer surface leaving a hydrogen passivated oxide free silicon surface on the wafer with improved control of the rat of etching of other regions formed in the fabrication of semiconductor wafers, for example, doped oxide regions.

In accordance with the present invention, the cleaning is performed with the use of two major components, hydrofluoric acid (HF) and an etch reducing component from the group of $(R)_4NOH$ wherein $R=(C_1-C_{20})$alkyls, either straight or branch chained, and further wherein each R is independently a $(C_1-C_{20})$alkyl, preferably a $(C_1-C_4)$alkyl, more preferably a $C_1$alkyl or a $C_2$alkyl, and most preferably the $C_1$alkyl. The etch reducing component including $(R)_4NOH$ wherein $R=C_2$alkyl is tetra ethyl ammonium hydroxide (TEAH) and the etch reducing component including $(R)_4NOH$ wherein $R=C_1$alkyl is tetra methyl ammonium hydroxide (TMAH).

Figure 1A:
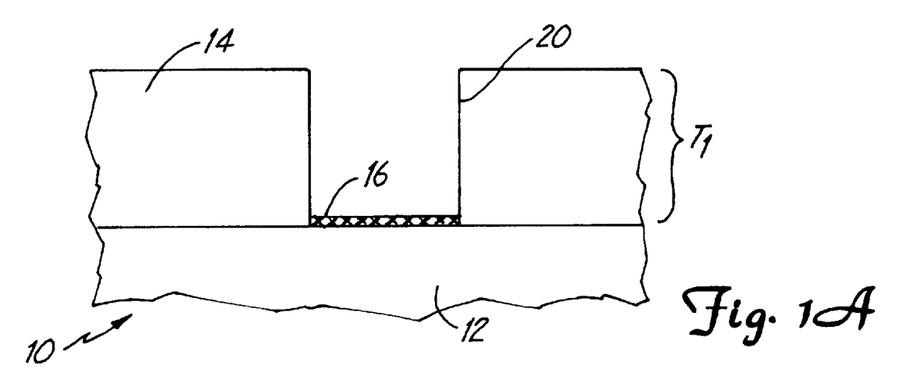
FIG. 1A and FIG. 1B are general illustrations of a wafer surface before and after cleaning, respectively, in accordance with the present invention.

A portion of a wafer 10 is shown in FIG. 1 A prior to cleaning or etching in accordance with the present invention. The wafer 10 includes a substrate 12 which, for example, is a silicon substrate. A film or layer 14 overlays the substrate 12 with an opening 20 defining an area in the substrate 12 which has native oxide 16 thereon. The film or layer 14 has a thickness of $T_1$.

Figure 1B:
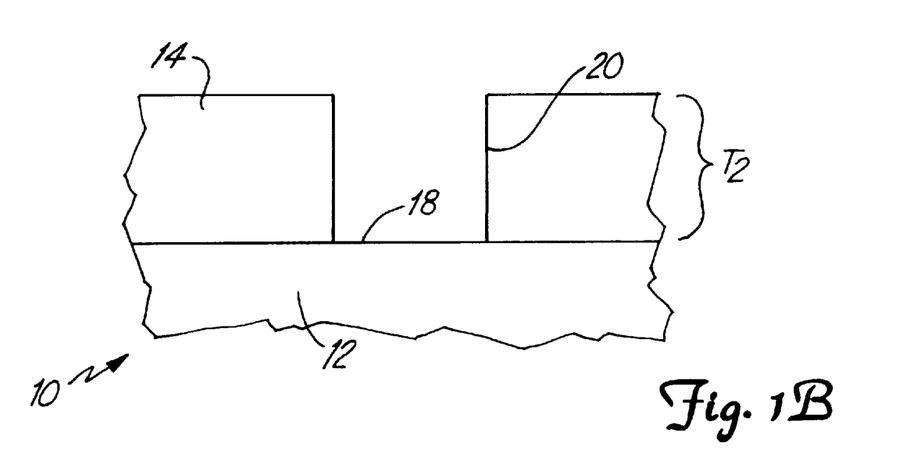

After etching in accordance with the present invention, the portion of the wafer 10 is shown in FIG. 1B. The wafer includes the film or layer 14 which has a thickness of $T_2$, wherein $T_2$ is less than $T_1$. The native oxide 16 has been etched or removed by the cleaning process and the hydrophobic oxide free silicon surface 18 results therefrom.

As illustrated by the FIGS. 1A and 1B, during the cleaning or etching process of removing the native oxide 16 from, for example, an active area of the wafer 10, the cleaning process also etches the film or layer 14 resulting in the thickness $T_2$ that is less than $T_1$. The etching of the film or layer 14 to quickly relative to the removal of native oxide leads to inadequate process control and causes difficulty in process integration. Therefore, the etch selectivity ratio of two different layers or surfaces is of importance when applying an etch or cleaning process to a wafer surface. This is of particular importance when the objective is to remove small amounts of native oxide, for example, from a silicon contact area or any other active area, yet limit the etching of an adjacent oxide, such as a deposited or doped oxide, which normally has a higher etch rate than the native oxide. The present invention provides an etch selectivity ratio of less than 4:1 for a doped/deposited oxide:thermal/native oxide etch. Further, the present invention more preferably provides an etch selectivity ratio of less than 2:1 and moreover, has provided an etch selectivity ratio as low as about 0.5:1 for a doped/deposited oxide:thermal/native oxide etch in which more thermal or native oxide is etched than deposited or doped oxide.

Cleaning in accordance with the present invention provides effective removal of the native oxide 16 and hydrogen passivation of the silicon surface 18 on the semiconductor wafer 10 while controlling the etch rate of the film or layer 14. The film or layer 14 may be any deposited oxide or doped oxide, such as, for example, tetraethylorthosilicate (TEOS) based oxide, BPSG, phosphosilicate glass (PSG), borosilicate glass (BSG); may be spin on glasses (SOGs); or may be any other material or wafer region which when subject to a conventional HF clean (without the addition of an etch reducing component as described above) would have an etching rate that may be beneficially reduced in accordance with the present invention.

Cleaning in accordance with the present invention including the use of the two components, hydrofluoric acid (HF) and the etch reducing component, can be performed in various different manners. For example, dipping or immersion of the wafer in a solution including these components may be utilized as described further below or cleaning with an HF vapor as described further below may be utilized. Further, any other method of cleaning the wafer may be utilized without departing from the scope of the present invention as defined in the accompanying claims. For example, other such methods may include centrifugal spraying and high pressure spraying with the cleaning solution in accordance with the present invention. Further, the methods described herein including the use of HF and an etch reducing component may be used in conjunction with other techniques, such as, for example, spinning the wafer during the clean, ultrasonic energy, or any other techniques utilized by one skilled in the art of cleaning wafer surfaces. Moreover, cleaning in accordance with the present invention can be combined with other cleaning methods and used with other cleaning solutions, whether before, in between or after such methods or solutions are used. For example, it can be utilized with a sulfuric acid/hydrogen peroxide, or "piranha" clean, or could be used after an RCA clean which may end in a surface having a native oxide thereon.

The remainder of the description shall be with reference to the more preferred etch reducing component, TMAH. However, it should be readily apparent to one skilled in the art that the parameters, conditions, and description with regard to TMAH would be relevant to the use of the other etch reducing components as set forth generically above.

Figure 2:
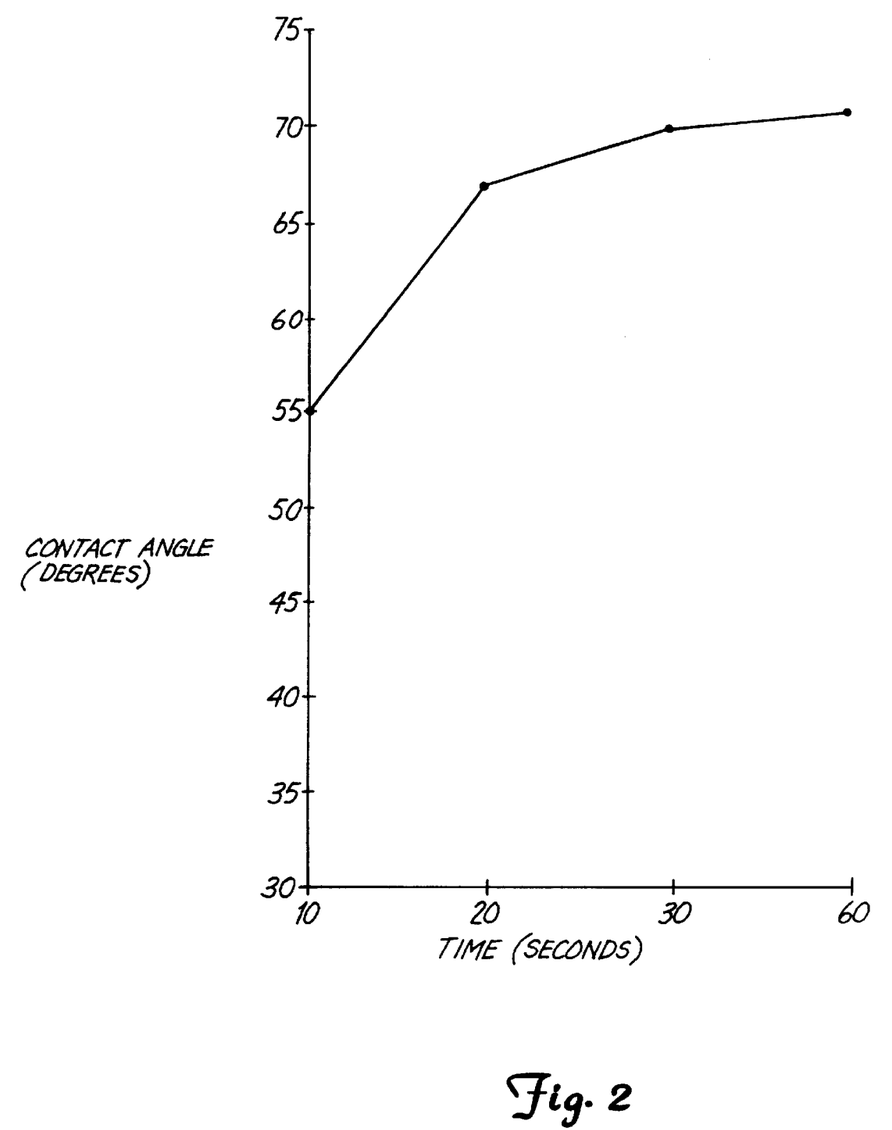
FIG. 2 is a graph showing the variance of contact angle between a droplet of DI water and the wafer surface as a function of dipping time in an aqueous HF solution.
Figure 3:
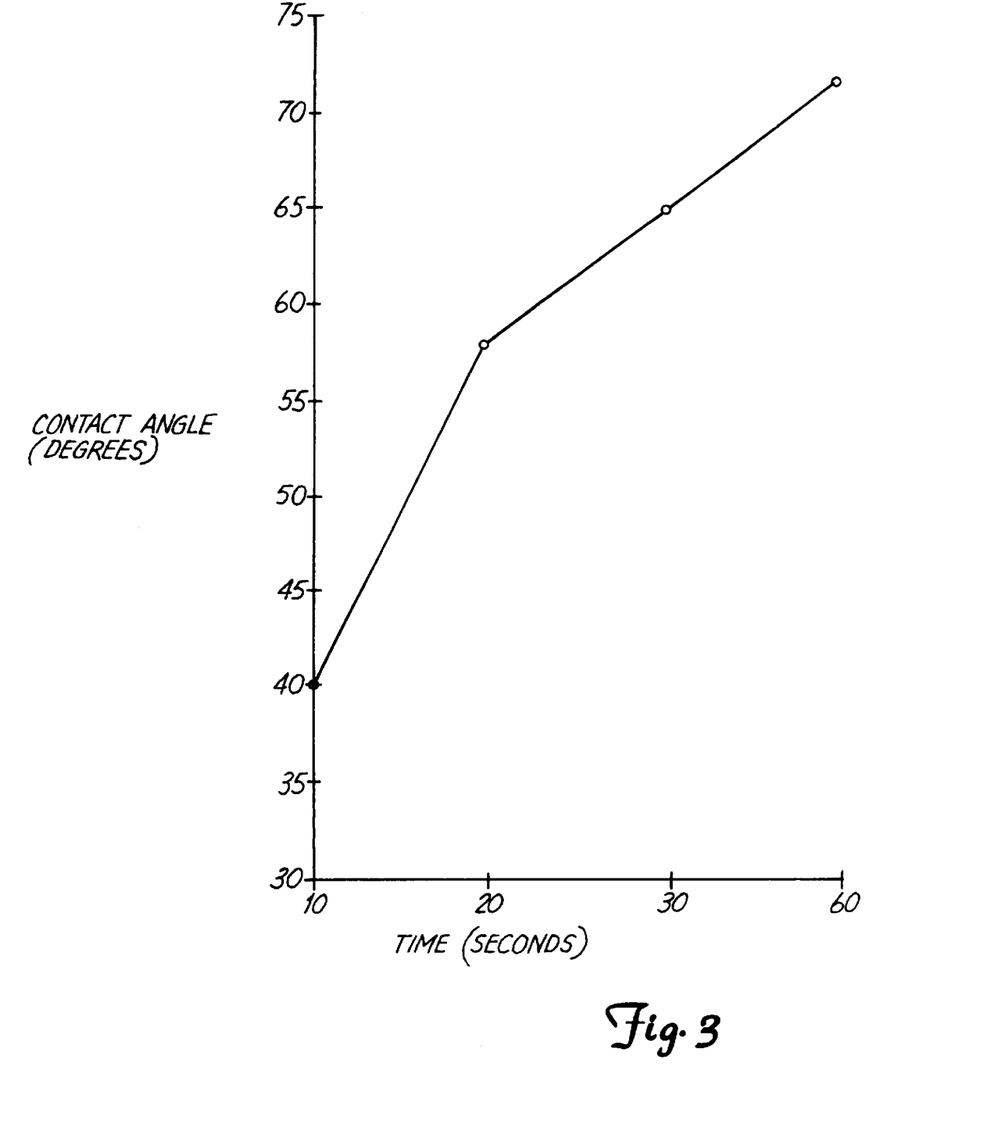
FIG. 3 is a graph showing the variance of contact angle between a droplet of DI water and the wafer surface as a function of dipping time in an aqueous HF solution with TMAH.
Figure 4:
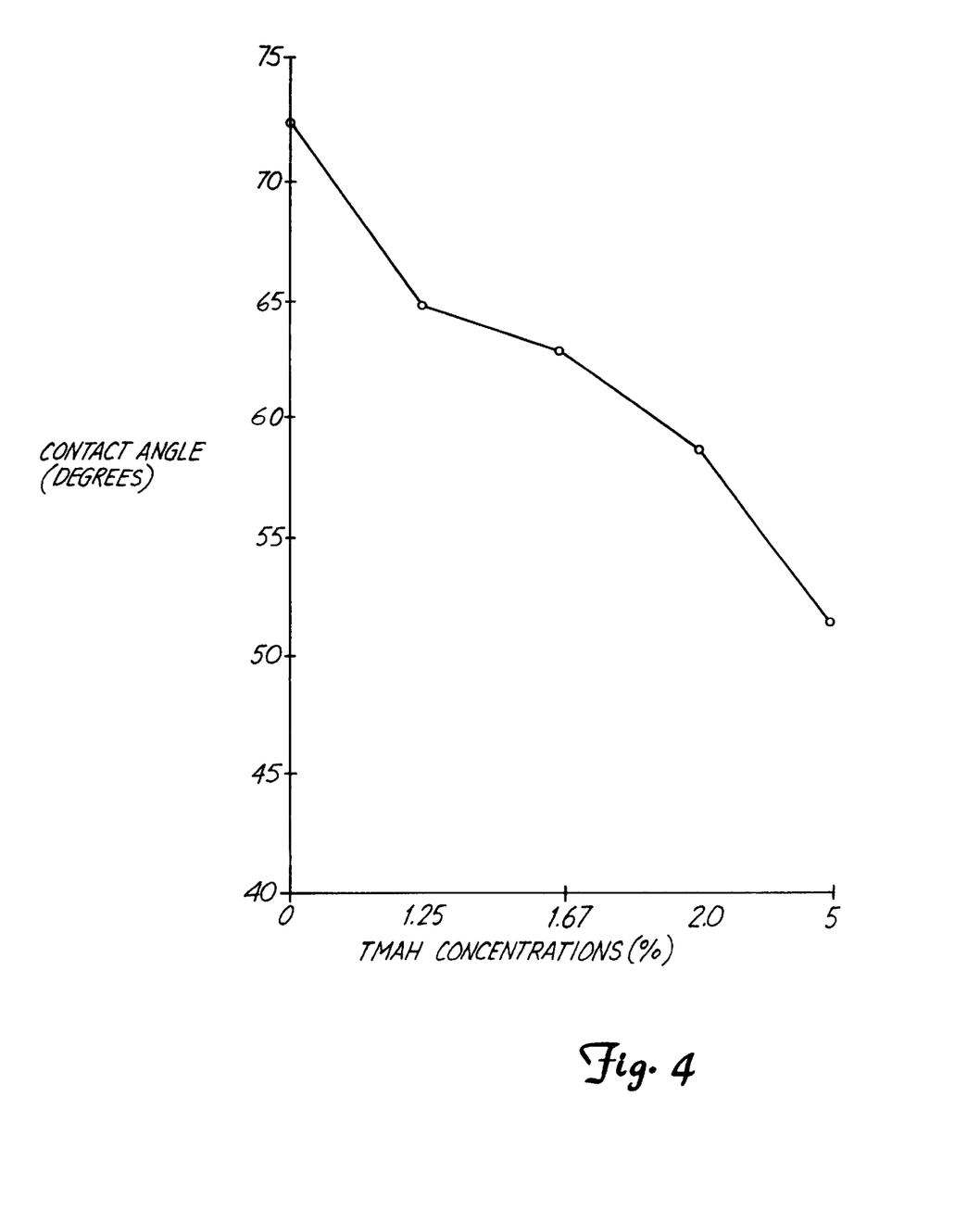
FIG. 4 is a graph showing the variance of contact angle between various HF+TMAH test solutions and the HF cleaned oxide free wafer surface as a function of the percent of TMAH added to the various HF+TMAH test solutions in accordance with the present invention.

A wafer cleaning solution and method of using the cleaning solution shall be described in further detail with particular reference to FIGS. 2–4, Examples 1 and 2, and Table 2. The semiconductor wafer cleaning solution of the present invention and the method of using the cleaning solution in accordance with the present invention includes the components previously mentioned, HF and an etch reducing component, preferably TMAH. The cleaning solution and method of this invention provides effective removal of the native oxide layer and hydrogen passivation of the surface on a semiconductor wafer while controlling the etch rate of other wafer regions, such as, for example, oxide regions, in particular doped or deposited oxides including BPSG, TEOS, and also thermal oxides.

The cleaning solution may be used at relatively low temperatures, preferably from 10° to 40° C., more particularly, from 15° to 25° C. At such temperatures, the cleaning is effective and long lasting. In contrast, it has traditionally been the practice to utilize high temperatures, for example from 60° C. to as high as 105° C., at which temperatures the process is more costly and requires additional equipment and monitoring. If desired, the cleaning solution of the present invention can be used at the higher temperatures used in the traditional methods, but those temperatures are not required for this solution to be effective.

The time required to treat the surface of the wafer for native oxide removal and hydrogen passivation can be adjusted and controlled by varying the concentrations of HF and TMAH in the solution, within the specified ranges for each of the two constituents. Additionally, the etch rate of other oxide regions of the wafers can likewise be controlled by varying the HF and TMAH concentrations in the cleaning solution.

In the HF cleaning, the native oxide on the silicon must be removed quickly and ended with a hydrogen passivated surface at the active areas of the wafer. An end result of a successful HF clean of the wafer is a hydrophobic wafer surface. The indicator used to measure removal of the native oxide and establishment of a hydrogen terminated and hydrophobic surface is the contact angle between a droplet of DI water and the wafer surface. When the contact angle between a droplet of DI water and the wafer surface is 700, it is considered that the surface is free of the native oxide and possesses a hydrogen passivated surface.

An improved wettability by the cleaning solution on the active areas of the wafer in the HF cleaning step is needed for better cleaning performance. The indicator used to measure wettability is the contact angle between a droplet of the cleaning solution and the HF cleaned oxide free surface. Increased wettability of the wafer surface is indicated by a decrease in the contact angle.

In the present invention, a wafer with a native oxide layer is treated with a cleaning solution including HF and TMAH. The HF concentration of the aqueous cleaning solution can range between 0.1% by weight to 49% by weight and still provide effective removal of the native oxide and surface conditioning of the wafer. It is preferred that the HF concentration be less than 40% by weight, more preferably in the range of 0.3% to 20% and further more preferably in the range of 0.4% to 5% by weight.

Further, the use of TMAH may be beneficial for use in buffered or other HF based solutions. Such solutions may include a dilute solution of HF buffered with, for example, ammonium fluoride ($NH_4F$) commonly referred to as a buffered HF solution (BHF), also called a Buffered-Oxide Etch (BOE) solution.

With respect to TMAH, the TMAH concentration in the cleaning solution can range between 0.1% and 25% by weight and still control the etch rate of wafer regions such as, for example, BPSG, TEOS and other thermal, doped or deposited oxides. It is preferable that both constituents, the HF and the TMAH used be of electronic purity grade or better.

The cleaning solution of the present invention and method of cleaning using the cleaning solution shall be further described by way of illustrating Examples 1 and 2 with reference to the FIGS. 2–4.

EXAMPLE 1

In this Example 1, the rate of etching of BPSG and thermal oxide was compared between a diluted HF test solution and an HF dilution with TMAH test solution when a wafer was dipped in the test solutions for 2 minutes. The rate at which material is removed from the surface film by etching for the two surface types, BPSG and thermal oxide, is referred to as the etch rate and is reported in Table 1 in angstroms per minute (Å/min). It was found that the etch rate could be controlled by adjusting the TMAH concentration in the solution. The etch rate for BPSG in the diluted HF test solution without TMAH as shown in Table 1 was 378 Å/min. The etch rate for thermal oxide in the diluted HF test solution without TMAH was 36 Å/min. The BPSG and thermal oxide etch rate continually decreases with increasing concentrations of TMAH. The etch rate for BPSG in the HF test solution with 2% TMAH as shown in Table 1 was only 19 Å/min. The etch rate for the thermal oxide in the HF test solution with 2% TMAH was reduced to 10 Å/min. In this Example 1, the BPSG etch rate is reduced about 20 times, and the etch rate ratio of BPSG:thermal oxide is significantly reduced from 10:1 to 2:1.

In addition, in this Example 1 the contact angle between a droplet of DI water and the wafer surface as a function of dipping time was also measured and is reported in the graphs in FIGS. 2 and 3. The wafers with the native oxide on the surface are dipped in a 100:1 $H_2O$:HF solution wherein the HF concentration is 0.49% by weight (FIG. 2) and are dipped in a 100:1 $H_2O$:HF/TNAH (2%) solution wherein the HF concentration is 0.45% by weight and the TMAH is 2% by weight (FIG. 3), for 10, 20, 30, and 60 seconds, and followed by DI water rinse and wafer drying. After the drying, the contact angle of a droplet of DI water on these wafers is measured. In comparison between the HF solution without TMAH and the HF solution containing TMAH, the rate of native oxide removal, as indicated by the contact angle of the DI water droplet, is slightly decreased in the HF+TMAH solution, but still very fast. A completely hydrogen passivated surface is obtained within a 1 minute dipping time.

TABLE 1

|  | BPSG | Thermal Oxide |
| --- | --- | --- |
| 100:1 $H_2O$:HF | 378 Å/min | 36 Å/min. |
| 100:1 $H_2O$:HF + 2%TMAH | 19 Å/min. | 10 Å/min. |

EXAMPLE 2

In this Example 2, the contact between a droplet of an HF/TMAH cleaning solution and an HF cleaned oxide free wafer surface was measured and is reported in FIG. 4. The contact angle of the cleaning solution droplet is reported in the graph in FIG. 4 as a function of the percent of TMAH added to each HF test solution. Five different concentrations of TMAH were added to a 100:1 $H_2O$:HF solution wherein the HF concentration of solution is about 0.5% by weight and the contact angle for a droplet of the cleaning solution on the wafer surface was measured for each of the solutions. The five concentrations of TMAH that were added to the 100:1 $H_2O$:HF solution were 0.0%, 1.25%, 1.67%, 2.5%, and 5.0%. The contact angle between the HF cleaned wafer surface and the HF/TMAH test solutions decreased with increased percent of TMAH added to the solution. These results, showing a decrease in contact angle, indicate that the HF/TMAH cleaning solution of this invention improves the wettability of the cleaning solution on the wafer surface.

Figure 5:
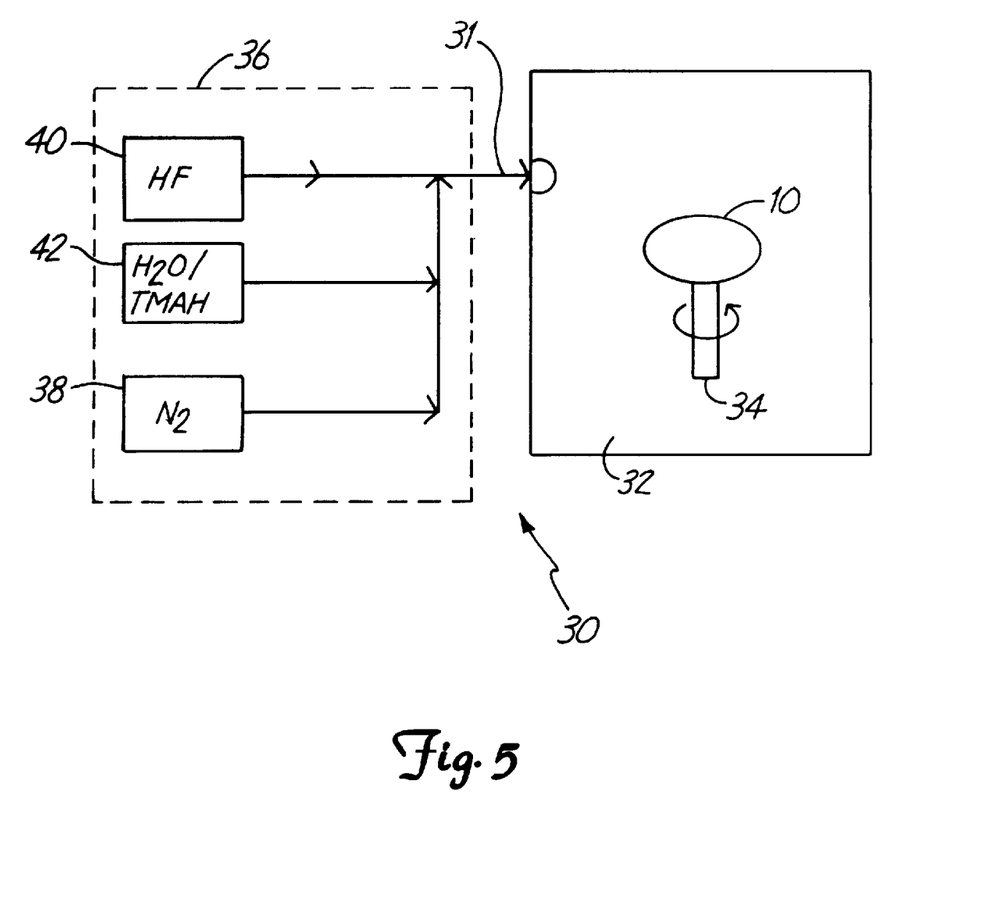
FIG. 5 is a general block diagram of an HF vapor processing system having components of an HF vapor provided thereto in accordance with the present invention.

An HF vapor cleaning method and system for performing such method shall be described in further detail with particular reference to FIG. 5, Examples 3–11 and Tables 2–10. A general block diagram of an HF vapor processing system 30 is shown in FIG. 5. The HF vapor system 30 includes a process chamber 32 for locating a wafer 10 for cleaning. The wafer 10 may be positioned upon a unit 34 for providing rotation to the wafer as it is being cleaned. An HF vapor is provided to the process chamber 32 by an inlet designated generally by arrow 31. The HF vapor is provided from vapor source 36, which includes a source for HF 40 such as a cylinder of anhydrous HF, a source for water vapor 42 such as deionized water, and a source for a carrier gas 38 such as nitrogen ($N_2$)

A typical HF vapor clean system is the gas processing system available under the trade designation, Excalibur, from FSI International, Chaska, Minn. This system is, at least in part, described in U.S. Pat. Nos. 4,749,440 and 4,857,142 incorporated herein by reference thereto.

Water vapor and HF can be delivered to the processing chamber 32 either separately or together. The water vapor can be provided to the processing chamber 32 by passing a carrier gas over a container of deionized water at a particular rate. Thus, the amount of water vapor utilized, particularly at the start of the etch, can be controlled by the flow rate of the $N_2$ and temperature used for vaporization of the water. It has been reported that to initiate etching of both native oxide and a doped or deposited oxide at approximately the same time and rate, and thus reduce the doped/deposited oxide:thermal/native oxide etch selectivity ratio, a relatively large concentration of water vapor at the start of the etch, for example, greater than 2000 ppm of water vapor in the HF vapor, should used. This is reported in the FSI "Technical Report DC/DE -Dry Cleaning/Dry Etching," FSI International, Chaska, Minn. (1990).

The source for providing TMAH in the HF vapor may include providing an amount of TMAHO the anhydrous HF for deliverance to the process chamber 32. Further, the source may include adding an amount of TMAH to the deionized water, as represented by block 42, and delivering the TMAH with the water vapor as the $N_2$ is passed over the deionized water/TMAH mixture. The TMAH may be provided to the HF vapor clean prior to delivery of water vapor or after. An illustration of the timing of the HF vapor clean may include starting the water vapor and allowing to stabilize, adding the TMAH and allowing to stabilize and then injecting the HF. As an alternative to the use of water vapor in the HF vapor clean, an alcohol vapor could be substituted therefor as is know to one skilled in the art.

It should be readily apparent to one skilled in the art that various modifications and alternatives for the provision of the HF vapor to the vapor chamber and the processing system in accordance with the present invention are contemplated as defined in the accompanying claims. For example, the carrier gas may be any inert gas, the HF may be anhydrous HF or diluted HF solution, various heating elements may be used with the system, etc. Further for example, various alternatives are given in the U.S. Patents listed above and are incorporated herein by reference.

From the data of the Examples and in the Tables below, a suitable recipe for performing a selective HF vapor etch of native oxide while maintaining control of the etching of, for example, adjacent doped oxides, may include providing an HF vapor to the vapor chamber that includes: providing a water vapor at a rate in the range of about 1000 sccm to about 10,000 sccm with an amount of TMAH therein greater than about 0.01 ppm to about 10% by weight of the vapor; providing an amount of anhydrous HF at a rate in the range of 20 sccm to 500 sccm; providing a carrier gas, $N_2$, at a rate of about 1000 sccm to about 10,000 sccm; and performing the etch for a time period in the range of about 1 seconds to about 300 seconds. The water vapor flow should be performed so as to have a water vapor in this range immediately at the initiation of the etch such that native oxide removal is performed substantially at the same time as etching of the other regions, such as the doped oxide regions.

Preferably, a suitable recipe for performing the selective HF vapor etch of native oxide while maintaining control of the etching of, for example, adjacent doped oxides, may include providing an HF vapor to the vapor chamber that includes: providing a water vapor at a rate in the range of about 3000 sccm to about 5000 sccm with an amount of TMAH therein greater than about 1 ppm but less than about 500 ppm; an amount of anhydrous HF at a rate in the range of 150 sccm to 400 sccm; a carrier gas, such as $N_2$, at a rate of 1000 sccm to about 10,000 sccm; and performing the etch for a time period in the range of about 3 seconds to about 30 seconds.

In each of the following Examples 3–11, 8" test wafers were etched using an FSI Excalibur 200 mm gas processing system available from FSI International, Chaska, Minn. The general recipe used for each Example included a 3750 sccm water vapor flow, a 5000 sccm $N_2$ flow, a 220 sccm HF, a 5 sec pretreat, and an 11 sec etch time. This recipe is applicable for each Example and the Examples differ from this general recipe only where so specified in the Example itself.

The test wafers include wafers having thermal oxide surfaces and BPSG deposited surfaces. The BPSG surfaces include about 3.6% B by weight and about 6.6% P by weight. The deposited BPSG was densified or reflowed by standard furnace techniques, for example, at about 700° C. for about 30 minutes. The wafers having thermal oxide at the surface were prepared in a conventional oxidation furnace. The 5 second pretreat performed included pretreating the surfaces with a flow of water vapor at about 3750 sccm and a flow of $N_2$ at about 5000 sccm.

In each of the Examples 3–9, TMAH was provided in the HF vapor to the process chamber of the FSI Excalibur system by filling the vapor chamber of the system with 25% TMAH. The $N_2$ carrier was then passed over the vapor chamber to pick up the water vapor and TMAH. Because of the vapor pressure of TMAH relative to water, the TMAH in the vapor flowing from the vapor chamber included only about 0.1 ppm to about 100 ppm.

In each of the Examples 3–11, measurements were performed after a DI water rinse and drying and at 49 locations across the wafer, with the minimum, maximum, and mean etched thickness recorded in the Table for each Example in angstroms (A). As all the etches were performed for 11 seconds, except for Example 9, ratios of etched thickness are directly comparable to etch rates. The range and standard deviation for the wafers was then calculated and also reported. The following tests described in the Examples were run sequentially starting with Example 3 and ending with Example 11.

EXAMPLE 3

This Example 3 included running four wafers, 2 BPSG and 2 thermal oxide, in the processing system and at the conditions described above. The results are shown in the following Table 2.

TABLE 2

| Wafer # | mean | min | max | std dev | range |
|---|---|---|---|---|---|
| Thermal - 1 | 296 | 261 | 337 | 7.1 | 75 |
| Thermal - 2 | 330 | 277 | 384 | 9.4 | 107 |
| BPSG - 1 | 211 | 10 | 694 | 64.8 | 684 |
| BPSG - 2 | 130 | 40 | 314 | 41.7 | 274 |

EXAMPLE 4

This Example 4 included running four wafers, 2 BPSG and 2 thermal oxide, in the processing system and at the conditions described above, except that a 10 second pretreat was performed rather than the 5 second pretreat. The results are shown in the following Table 3.

TABLE 3

| Wafer # | mean | min | max | std dev | range |
|---|---|---|---|---|---|
| Thermal - 1 | 542 | 519 | 580 | 3 | 61 |
| Thermal - 2 | 581 | 555 | 609 | 2.8 | 54 |
| BPSG - 1 | 335 | 5 | 1086 | 83 | 1081 |
| BPSG - 2 | 293 | 23 | 801 | 53 | 778 |

EXAMPLE 5

This Example 5 included running four wafers, 2 BPSG and 2 thermal oxide, in the processing system and at the conditions described above. The results are shown in the following Table 4.

TABLE 4

| Wafer # | mean | min | max | std dev | range |
|---|---|---|---|---|---|
| Thermal - 1 | 406 | 381 | 448 | 4.5 | 67 |
| Thermal - 2 | 431 | 400 | 471 | 4.3 | 70 |
| BPSG - 1 | 346 | 18 | 1099 | 70 | 1081 |
| BPSG - 2 | 388 | 1 | 1192 | 74 | 1191 |

EXAMPLE 6

This Example 6 included running four wafers, 2 BPSG and 2 thermal oxide, in the processing system and at the conditions described above. The results are shown in the following Table 5.

TABLE 5

| Wafer # | mean | min | max | std dev | range |
|---|---|---|---|---|---|
| Thermal - 1 | 365 | 342 | 399 | 4 | 57 |
| Thermal -2 | 382 | 334 | 415 | 5.5 | 81 |
| BPSG - 1 | 340 | 3 | 1025 | 76 | 1023 |
| BPSG - 2 | 313 | 34 | 934 | 77 | 900 |

EXAMPLE 7

This Example 7 included running four wafers, 2 BPSG and 2 thermal 110 oxide, in the processing system and at the conditions described above, except that a 110 sccm HF flow was utilized rather than the 220 sccm flow. The results are shown in the following Table 6.

TABLE 6

| Wafer # | mean | min | max | std dev | range |
|---|---|---|---|---|---|
| Thermal - 1 | 7 | 0 | 18 | 60 | 18 |
| Thermal - 2 | 8 | 0 | 18 | 46 | 18 |
| BPSG - 1 | 218 | 20 | 387 | 44 | 367 |
| BPSG - 2 | 205 | 22 | 394 | 48 | 372 |

EXAMPLE 8

This Example 8 included running four wafers, 2 BPSG and 2 thermal oxide, in the processing system and at the conditions described above, except that a 330 sccm HF flow was utilized rather than the 220 sccm flow. The results are shown the following Table 7.

TABLE 7

| Wafer # | mean | min | max | std dev | range | typical |
|---|---|---|---|---|---|---|
| Thermal - 1 | 610 | 578 | 648 | 2.8 | 71 | — |
| Thermal - 2 | 671 | 624 | 722 | 3.7 | 98 | — |
| BPSG - 1 | 520 | 13 | 1800 | 90 | 1787 | 300 |
| BPSG - 2 | 513 | 6 | 1794 | 87 | 1788 | 260 |

EXAMPLE 9

This Example 9 included running four wafers, 2 BPSG and 2 thermal oxide, in the processing system and at the conditions described above, except that the etch was performed for 3 seconds rather than 11 seconds. The results are shown in the following Table 8.

TABLE 8

| Wafer # | mean | min | max | std dev | range |
|---|---|---|---|---|---|
| Thermal - 1 | 6 | 0 | 26 | 78 | 20 |
| Thermal - 2 | 5 | 0 | 20 | 99 | 20 |
| BPSG - 1 | 177 | 31 | 349 | 40 | 318 |
| BPSG - 2 | 178 | 1 | 533 | 58 | 534 |

EXAMPLE 10

This Example 10 included running four wafers, 2 BPSG and 2 thermal oxide, in the processing system and at the conditions described above, except that the vapor chamber was manually drained of the water/TMAH mixture and filled with only deionized water. Eight dummy etch runs were then performed after the drain and fill and then the four test wafers were etched according to the conditions above with only water in the vapor chamber. The results are shown in the following Table 9.

TABLE 9

| Wafer # | mean | min | max | std dev | range |
|---------|------|-----|------|---------|-------|
| Thermal - 1 | 478 | 440 | 529 | 3.6 | 89 |
| Thermal - 2 | 483 | 436 | 522 | 5 | 86 |
| BSG - 1 | 343 | 1 | 1495 | 124 | 1495 |
| BPSG-2 | 219 | 2 | 784 | 87 | 782 |

EXAMPLE 11

This Example 11 included running four wafers, 2 BPSG and 2 thermal oxide, in the processing system and at the conditions described above, after the drain/fill as described in Example 10 and further after the vapor chamber was manually drained and filled 3 additional times and an additional 8 dummy etch runs were performed prior to etching the four test wafers according to the general conditions described above and once again with only DI water in the vapor chamber. The results are shown in the following Table 10.

TABLE 10

| Wafer # | mean | min | max | std dev | range |
|---------|------|-----|------|---------|-------|
| Thermal - 1 | 473 | 399 | 507 | 6.6 | 108 |
| Thermal - 2 | 478 | 414 | 523 | 5.2 | 98 |
| BPSG - 1 | 633 | 187 | 779 | 88 | 1761 |
| BPSG - 2 | 506 | 1 | 1799 | 97 | 1792 |

Conclusions extracted from the above data included that a BPSG:thermal oxide etch selectivity ratio, based on the mean value, in the range of between about 0.5:1 and 1:1 can be achieved with the use of TMAH in the HF vapor clean (See Examples 1–4). Further, it is shown that worst case etch selectivity ratio (maximum BPSG:minimum thermal oxide) is in the range of about 1:1 to about 3:1 (See Examples 1–4). It is also shown that an HF partial pressure controls the maximum BPSG loss as is shown by the Example 7 which showed the worst case selectivity. Example 9 suggests that a longer etch period is necessary to achieve a lower etch selectivity ratio. However, this is mainly caused by the delay in the initiation of removal of native oxide as compared to doped oxides which could be modified by providing additional heat up front and a water vapor sufficient to reduce the etch selectivity ratio early in the etch. Lastly, it is suggested by the data that native oxide can be stripped with 300 to 500 Å maximum of BPSG loss in an HF vapor including TMAH.

It is also apparent from the Examples 10 and 11, that very little TMAH is necessary to reduce the BPSG:thermal oxide etch selectivity as even after . the drain and fill procedures were performed, the etch selectivity ratio stayed less than 1.5:1 due to residual TMAH which was not completely flushed from system. This reflects that a small amount of TMAH remained in the vapor chamber and reduced the etch selectivity.

In addition, the HF vapor system described can be used with cluster-based tools and processes to provide in situ cleaning which is integrated into a A multi-purpose module for use in the cluster tool. The use of an HF vapor clean with the TMAH component would reduce the fast etching of deposited or doped oxides relative to the etching of native oxide which would benefit the HF vapor process when used in a cluster tool.

Although the invention has been described with particular reference to preferred embodiments thereof, variations and modifications of the present invention can be made within a contemplated scope of the following claims as is readily known to one skilled in the art.

What is claimed is:

1. A system for performing an HF vapor cleaning process, comprising:
    a single vapor chamber for positioning a wafer having a wafer surface;
    a carrier gas source for providing an inert carrier gas;
    a vapor source operable using the inert carrier gas for providing one of a water vapor or an alcohol vapor to the single vapor chamber;
    a hydrofluoric acid (HF) source for providing a hydrofluoric acid component to the single vapor chamber;
    an etch reducing component source for providing an etch reducing component to the single vapor chamber; and
    wherein the single vapor chamber provides an HF vapor for cleaning the wafer surface, the HF vapor including a combination of:
    the hydrofluoric acid (HF) component;
    the one of a water vapor or an alcohol vapor; and
    the etch reducing component, wherein the etch reducing component is from the group of $(R)_4NOH$ wherein $R=(C_1-C_{20})$alkyls, either straight or branch chained, and further wherein each R is independently a $(C_1-C_{20})$alkyl.

2. The system according to claim 1, wherein R is a $(C_1-C_4)$alkyl.

3. The system according to claim 2, wherein the etch reducing component is one of tetra ethyl ammonium hydroxide (TEAH) and tetra methyl ammonium hydroxide (TMA).

4. The system according to claim 3, wherein the etch reducing component is TMAH.

5. The system according to claim 4, wherein the etch reducing component is TMAH in an amount greater than about 0.01 ppm of the HF vapor.

6. The system according to claim 5, wherein the TMAH is in an amount in the range of 1 ppm to 500 ppm.

* * * * *

UNITED STATES PATENT AND TRADEMARK OFFICE
CERTIFICATE OF CORRECTION

PATENT NO. : 6,235,145 B1
DATED : May 22, 2001
INVENTOR(S) : Li et al.

It is certified that error appears in the above-identified patent and that said Letters Patent is hereby corrected as shown below:

Column 1,
Line 4, delete "This is a continuation of application Ser. No. 08/659,145, filed Jun. 5, 1996 (pending), and an continuation-in-part application of U.S. patent application Ser. No. 08/559,188 filed on Nov. 13, 1995 and hereby incorporated in its entirety by reference which is incorporated herein by reference" and insert -- This is a continuation of application No. 08/659,145, filed on Jun. 5, 1996, which is a continuation-in-part of application No. 08/559,188, filed on Nov. 13, 1995, both of which are incorporated herein by reference, -- therefor.
Line 28, delete "%wafer" and insert -- wafer -- therefor.
Line 34, delete "*wet" and insert -- wet -- therefor.
Line 48, delete "PICA" and insert -- RCA -- therefor.

Column 2,
Line 14, delete "pros ide" and insert -- provide -- therefor.
Line 37, delete "shows" and insert -- shown -- therefor.

Column 3,
Line 1, delete "surface and and means" and insert -- surface and means -- therefor.
Line 43, delete "rat" and insert -- rate -- therefor.

Column 4,
Line 8, delete "to" and insert -- too -- therefor.

Column 5,
Line 47, delete "700" and insert -- 70° -- therefor.

Column 7,
Line 49, after "should" insert -- be -- therefor.
Line 53, delete "an amount of TMAHO the anhydrous" and insert -- an amount of TMAH in the andydrous -- therefor.

Column 11,
Line 55, delete "after ." and insert -- after -- therefor.

UNITED STATES PATENT AND TRADEMARK OFFICE
CERTIFICATE OF CORRECTION

PATENT NO. : 6,235,145 B1
DATED : May 22, 2001
INVENTOR(S) : Li et al.

It is certified that error appears in the above-identified patent and that said Letters Patent is hereby corrected as shown below:

Column 12, claim 3,
Line 47, delete "(TMA)" and insert -- (TMAH) -- therefor.

Signed and Sealed this

Twelfth Day of March, 2002

*Attest:*

*Attesting Officer*

JAMES E. ROGAN
*Director of the United States Patent and Trademark Office*